(12) United States Patent
Lanes

(10) Patent No.: US 12,112,109 B2
(45) Date of Patent: Oct. 8, 2024

(54) SECURE CONTROL DEVICE, CONTACTOR COMPRISING SUCH A DEVICE AND METHOD FOR SECURE PROCESSING OF A CONTROL SIGNAL

(71) Applicant: Schneider Electric Industries SAS, Rueil Malmaison (FR)

(72) Inventor: David Lanes, Saint Hilaire du Touvet (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 990 days.

(21) Appl. No.: 17/101,569

(22) Filed: Nov. 23, 2020

(65) Prior Publication Data

US 2021/0165943 A1 Jun. 3, 2021

(30) Foreign Application Priority Data

Nov. 28, 2019 (FR) ...................................... 1913362

(51) Int. Cl.
*G06F 30/367* (2020.01)
*G06F 13/40* (2006.01)
*G06F 30/373* (2020.01)

(52) U.S. Cl.
CPC ........ *G06F 30/367* (2020.01); *G06F 13/4022* (2013.01); *G06F 30/373* (2020.01)

(58) Field of Classification Search
CPC ... G06F 30/367; G06F 13/4022; G06F 30/373
See application file for complete search history.

(56) References Cited

U.S. PATENT DOCUMENTS

| 5,929,663 | A | * | 7/1999 | Dougherty | ........ H02J 13/00009 327/104 |
| 6,148,055 | A | * | 11/2000 | Sakai | ............. G01R 31/318527 377/28 |
| 2004/0199837 | A1 | | 10/2004 | Meyer-Grafe et al. | |
| 2011/0169345 | A1 | | 7/2011 | Matsumoto et al. | |

(Continued)

FOREIGN PATENT DOCUMENTS

| EP | 0897210 A2 | 2/1999 |
| EP | 1172662 A2 | 1/2002 |

(Continued)

OTHER PUBLICATIONS

Sajjad Hajdar Current Limiter Offers Circuit Protection with Low Voltage Drop Electronic Design Apr. 18, 2016 (Year: 2016).*

(Continued)

*Primary Examiner* — Rehana Perveen
*Assistant Examiner* — Cuong V Luu
(74) *Attorney, Agent, or Firm* — Locke Lord LLP

(57) ABSTRACT

A safety control device intended to process a control signal and generate a safety control order. The device has:
  a control input,
  a protection circuit,
  a coupler having an emitter circuit designed to emit a second signal and a receiver circuit for providing a third signal,
  a switch,
  a pulse generator designed to cyclically control opening and closure of the switch, and
  a processing circuit designed to execute a method for safely processing the third signal.
Also disclosed are a contactor having such a control device and a method for safely processing a control signal.

19 Claims, 10 Drawing Sheets

(56) References Cited

U.S. PATENT DOCUMENTS

| | | | |
|---|---|---|---|
| 2016/0118212 A1 | 4/2016 | Veil et al. | |
| 2016/0149514 A1* | 5/2016 | Faschang | H02M 7/537 363/131 |
| 2019/0068088 A1* | 2/2019 | Xu | G05B 9/02 |

FOREIGN PATENT DOCUMENTS

| | | | |
|---|---|---|---|
| EP | 1538651 A2 | 6/2005 | |
| FR | 2400229 A1 | 3/1979 | |
| FR | 2725857 A1 | 4/1996 | |

OTHER PUBLICATIONS

Republique Francaise Institut National De La Propriete Industrielle, French Search Report and Opinion for French Patent Application No. FR1913362 dated Jul. 24, 2020, 13 pages.

* cited by examiner

SECURE CONTROL DEVICE, CONTACTOR COMPRISING SUCH A DEVICE AND METHOD FOR SECURE PROCESSING OF A CONTROL SIGNAL

TECHNICAL FIELD

The present invention relates to a safety control device intended in particular to control a contactor. The invention also relates to a method for safely processing a control signal for closing or opening a contactor and to a contactor having a safety control device.

PRIOR ART

Many devices have one or more contactors for controlling the powering on or powering off of electrical units, such as production machines, motors, welding devices, etc. Some devices whose operation is hazardous require increased safety in order to control them, and in particular have to have an emergency stop means in order to interrupt operation in the event of danger. In order to bolster the safety of goods and people, a command to start operation of an electric motor may be subject to validation in order to avoid any unwanted command caused for example by electromagnetic interference. In this case, when a command is invalid, the device has to be put into a safe state, generally corresponding to the device being stopped.

Document EP 1 538 651 A2 is known and relates to an emergency stop circuit having two lines operating in parallel, each line having contacts, the actuation of which is controlled by central units. The supply of power for the commands for the contacts is disconnected when an emergency stop is requested.

Patent application US 2004/0199 837 A describes a method and a device for the safe transmission of information between input and output units of a safety system.

Patent application US 2011/0169345 A1 describes a control system that prevents starting of a load when the command for or the supply of power to the load exhibits an anomaly.

DESCRIPTION OF THE INVENTION

The present invention relates to a safety control device intended to process a control signal and generate a first safety control order, said safety control device comprising:
  a control input having at least a first connection point and a second connection point, said control input being designed to receive the control signal,
  a first protection circuit,
  a first coupler having:
    a first emitter circuit connected in series with the first protection circuit, the assembly formed by the first emitter circuit and the first protection circuit being connected between the first connection point and the second connection point, said first emitter circuit being designed to emit a second signal when the control signal is present on the control input, and
    a first receiver circuit designed to receive the second signal and to provide a third signal formed of at least one pulse,
  a first switch connected in parallel across the first emitter circuit,
  a pulse generator connected to the first switch and designed to cyclically control opening and closure of the first switch, and
  a first processing circuit connected to the first receiver circuit in order to receive the third signal, said first processing circuit being designed to process the third signal and provide the first safety control order, said first safety control order being able to adopt at least two states:
    a first start safety control order, or
    a first stop safety control order.

Advantageously, the first emitter circuit and the first receiver circuit are galvanically isolated from one another.

Advantageously, the first coupler has at least one optocoupler, the first emitter circuit having an emitting diode and the first receiver circuit having a phototransistor, the emitting diode emitting radiation that forms a medium for transmitting the second signal to the phototransistor through an electrically insulating wall transparent to the radiation.

Advantageously, the pulse generator generates pulses having a predefined duty cycle less than or equal to 50%.

Preferably, the pulse generator generates pulses at a frequency of between 100 Hz and 10 kHz.

Advantageously, the first protection circuit has a current-limiting circuit for limiting the current flowing through said protection circuit.

Advantageously, the first protection circuit has a current threshold detection circuit connected to the current-limiting circuit in order to limit the current flowing through said protection circuit to a predefined maximum intensity when the amplitude of the control signal is greater than a predefined maximum voltage threshold.

In one particular embodiment, a voltage threshold detection circuit is connected in series with the first protection circuit and the first emitter circuit in order to limit the current flowing through said emitter circuit to a predefined minimum intensity when the amplitude of the control signal is less than a predefined minimum voltage threshold.

In one particular embodiment, the first switch is connected in series with the first protection circuit and the first emitter circuit.

According to one variant, the safety control device furthermore has:
  a validation input having a third connection point, said validation input being designed to receive a validation signal,
  a second protection circuit,
  a second coupler having:
    a second emitter circuit connected in series with the second protection circuit, the assembly formed by the second emitter circuit and the second protection circuit being connected between the third connection point and the second connection point of the safety control device, said second emitter circuit being designed to emit a fourth signal when the validation signal is present on the validation input, and
    a second receiver circuit designed to receive the fourth signal and to provide a fifth signal,
  a second switch connected firstly in parallel across the second emitter circuit and connected secondly to the pulse generator so that said pulse generator cyclically controls opening and closure of said second switch,
  a second processing circuit connected to the second receiver circuit in order to receive the fifth signal, said second processing circuit being designed to process the fifth signal and provide a second safety control order, said second safety control order being able to adopt at least two states:
    a second start safety control order and
    a second stop safety control order a logic circuit having:
  a first binary input connected to the first processing circuit in order to receive the first safety control order,
  a second binary input connected to the second processing circuit in order to receive the second safety control order, and
  a second binary output for providing a third safety control order.

Advantageously, the third safety control order adopts at least two states:
  a third start safety control order when a first safety control order provided by the safety control device is a first start safety control order and when the second safety control order is a second start safety control order, or
  a third stop safety control order when a first safety control order provided by the safety control device is a first stop safety control order or when the second safety control order is a second stop safety control order.

The present invention also relates to a contactor having:
  at least one electrical contact connected to an upstream current line and a downstream current line, said electrical contact being designed to allow the flow of an electric current between the upstream current line and the downstream current line to be permitted or blocked,
  an actuator designed to actuate the at least one electrical contact,
  a safety control device, as described above, connected to the actuator in order to provide a first safety control order to said actuator in order to control the actuation of the at least one electrical contact,
  a first connection terminal connected to a first connection point of said safety control device, and
  a second connection terminal connected to a second connection point of said safety control device,
  said contactor being such that the safety control device controls the actuator:
    so as to execute closure of the at least one electrical contact when the first safety control order is a first start safety control order, or
    so as to execute opening of the at least one electrical contact when the first safety control order is a first stop safety control order.

Advantageously, the contactor furthermore has a third connection terminal connected to a third connection point of the safety control device. The safety control device is connected to the actuator via a second binary output in order to provide a third safety control order to the actuator, said third safety control order being able to adopt at least two states:
  a third start safety control order, or
  a third stop safety control order.

The safety control device, by providing a third safety control order to the actuator, controls said actuator:
  so as to execute closure of the at least one electrical contact when the third safety control order is a third start safety control order, or
  so as to execute opening of the at least one electrical contact when the third safety control order is a third stop safety control order.

The present invention also relates to a method for safely processing a third signal formed of at least one pulse provided by at least a first receiver circuit of a safety control device as described above, said method comprising iteratively counting a number of pulses provided by the first receiver circuit during a time interval of a predefined duration.

Advantageously, a first counter is incremented when the number of pulses counted during a time interval is between a predefined minimum number of pulses and a predefined maximum number of pulses.

Preferably, a first start safety control order is generated when the first counter is equal to or greater than a predefined validation threshold.

Preferably, a second counter is incremented when the number of pulses counted during the time interval is not between the minimum number of pulses and the maximum number of pulses.

Preferably, a first stop safety control order is generated when the second counter is equal to or greater than a predefined invalidation threshold.

BRIEF DESCRIPTION OF THE DRAWINGS

Other advantages and features will become more clearly apparent from the following description and from particular embodiments of the invention, given by way of non-limiting example and shown in the appended drawings, in which.

DETAILED DESCRIPTION OF PREFERRED EMBODIMENTS

Figure 1:
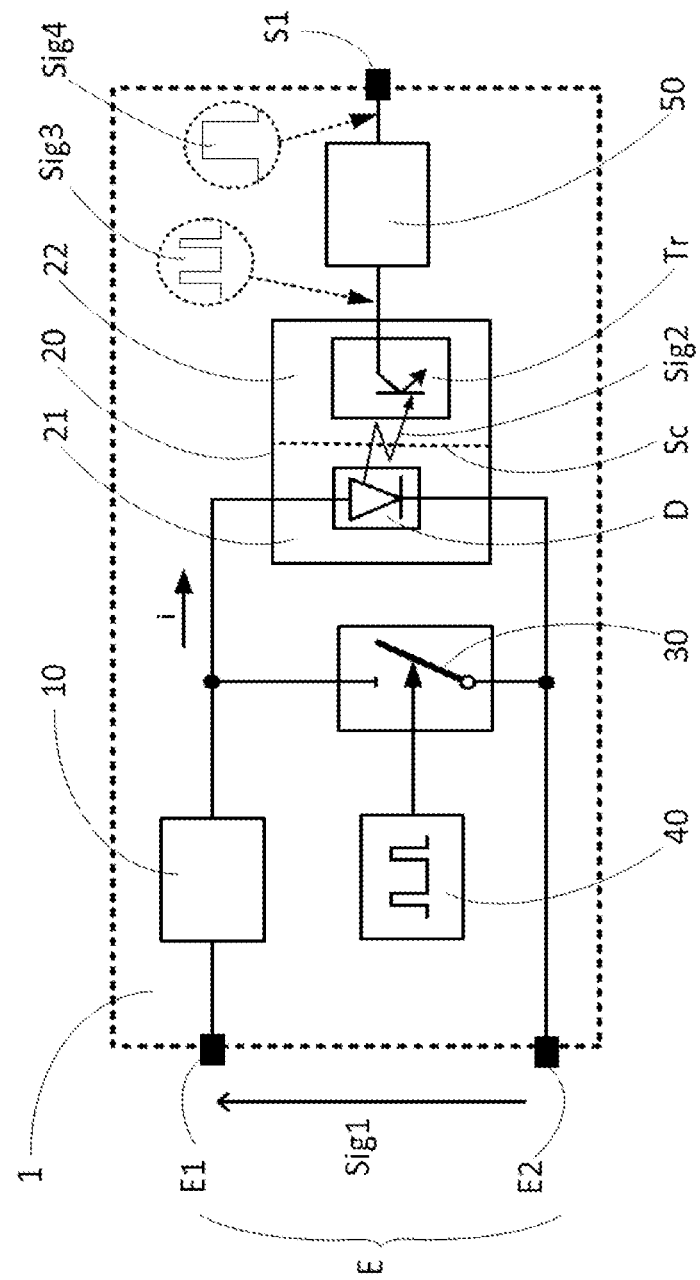
FIG. 1 shows, in the form of a block diagram, a safety control device according to the invention.

FIG. 1 shows, in the form of a block diagram, a safety control device 1 intended to process a control signal Sig1 and generate a first safety control order. Said safety control device 1 comprises at least:
  a control input E,
  a first protection circuit 10,
  a first coupler 20,
  a first switch 30,
  a pulse generator 40,
  a first processing circuit 50, and
  a first binary output S1.

The control input E has at least a first connection point E1 and a second connection point E2. The control signal Sig1 is applied between the first point E1 and the second point E2. The control signal Sig1 is preferably a continuous voltage level or stage with an amplitude Vsig1 of between 1 volt and 30 volts, preferably with a duration of between 5 ms and 100 ms.

Figure 2A:
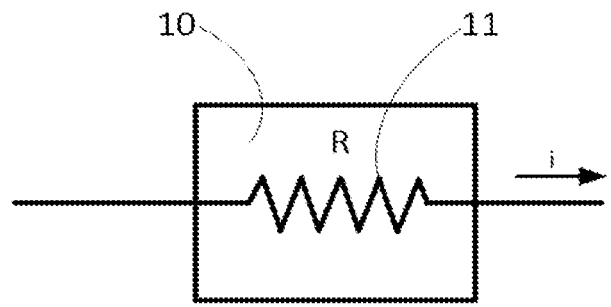
FIGS. 2a and 2b show variant embodiments of a protection circuit forming part of the safety control device.

The first protection circuit 10 is designed to clip the control signal Sig1 if it has an abnormally high amplitude Vsig1 and/or to limit a current i flowing in the safety control device 1, when a control signal Sig1 is applied. A first embodiment of the first protection circuit 10 is shown in FIG. 2a and has a current limiter 11 consisting for example of at least one resistor R. The resistor R is preferably dimensioned so as to limit the current i to a predefined maximum intensity IMax of between 1 mA and 100 mA.

Figure 2B:
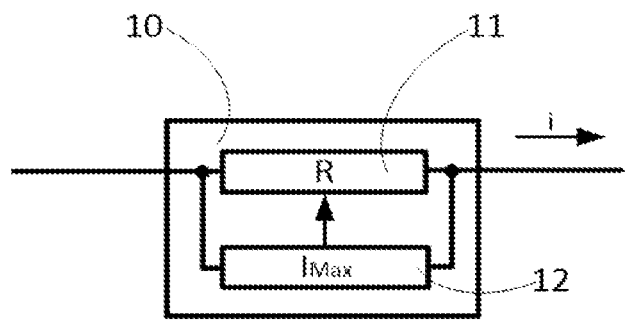

As a variant, the first protection circuit 10 has a current limiter 11 connected to a current threshold detection circuit 12, as shown in FIG. 2b. FIG. 2d shows a variation curve of the current i flowing in the first protection circuit 10 as a function of the amplitude Vsig1 of the control signal Sig1. When the intensity of the current i is less than the maximum current intensity IMax, the current threshold detection circuit 12 does not act, and the current i is set by the ratio between the amplitude Vsig1 of the control signal Sig1 and the value of the resistance R in accordance with Ohm's law. For example, for an amplitude Vsig1 of the control signal Sig1 equal to 24 volts and for a resistance R equal to 2000 ohms, the amplitude of the current i will be equal to 12 mA. When the amplitude Vsig1 of the control signal Sig1 exceeds a predefined maximum voltage threshold Umax, the current threshold detection circuit 12 acts on the current limiter 11 so as to increase the value of the resistance R in order to keep the intensity of the current i at the predefined maximum current intensity IMax. Thus, with the current i being constant, the power dissipated and therefore the heating in the current limiter 11 vary only in accordance with a linear law as a function of the amplitude Vsig1 of the control signal Sig1.

Figure 2C:
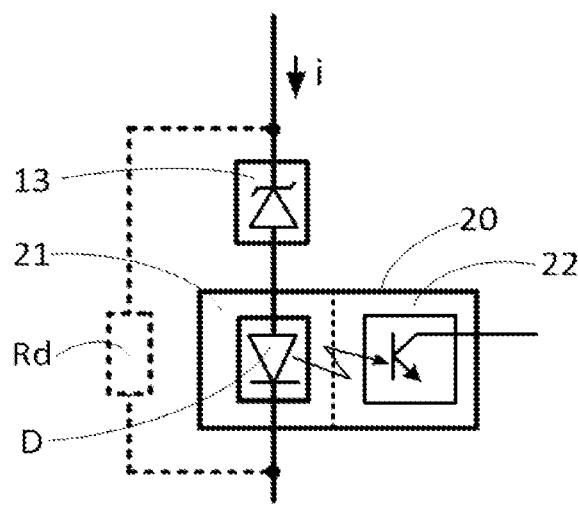
FIG. 2c shows a combination of a voltage threshold detection circuit and a first coupler circuit.
Figure 2D:
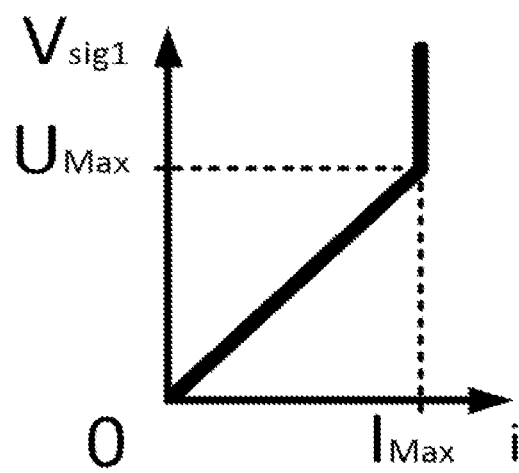
FIG. 2d shows a variation curve of a current flowing in the protection circuit.
Figure 2E:
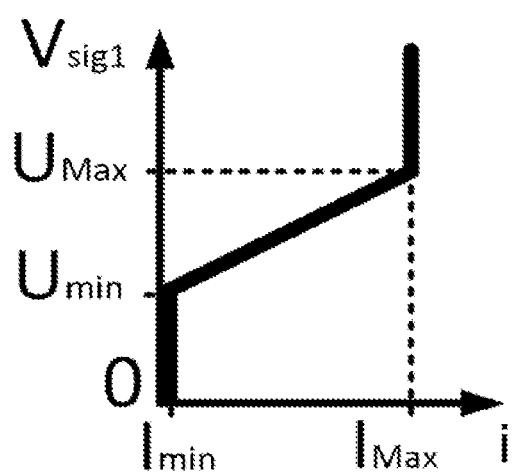
FIG. 2e shows a variation curve of a current flowing in a first emitter circuit.

Optionally, a voltage threshold detection circuit 13 is connected in series with the first protection circuit 10 and with the first coupler 20, as shown in FIG. 2c. In this configuration, the voltage threshold detection circuit 13 detects a predefined minimum voltage threshold Umin. For as long as the amplitude Vsig1 of the control signal Sig1 is less than said minimum voltage threshold Umin, the voltage threshold detection circuit 13 limits the current i flowing in a first emitter circuit 21 of the first coupler 20 to a predefined minimum intensity Imin. When the amplitude Vsig1 of the control signal Sig1 is greater than the minimum voltage threshold Umin, the voltage threshold detection circuit 13 is inactive, and the current i is limited only by the current limiter 11. A curve representative of the variation in the current i flowing in the first protection circuit 10 as a function of the amplitude Vsig1 of the control signal Sig1 in such an operating mode is shown in FIG. 2e. Such a voltage threshold detection circuit 13 is used so that the first coupler 20 receives the control signal Sig1 only if said control signal Sig1 has an amplitude greater than the minimum voltage Umin, in order for example to eliminate stray signals. The threshold detection circuit 13 may consist of at least one Zener diode.

Optionally, for example in order to comply with the recommendations in the IEC60947-1 Standard, Appendix S, which deals with digital inputs for low-voltage appliances, a bypass resistor Rd is connected in parallel across the threshold detection circuit 13 and the first coupler 20, as shown in FIG. 2c, so that a current i is always present even when the first switch 30 is open and when the amplitude Vsig1 of the control signal Sig1 is less than the minimum voltage Umin. The bypass resistor Rd may also be connected in parallel across the first switch 30.

In one preferred embodiment, the current limiter 11 limits the amplitude of the current i to a predefined maximum current intensity IMax of between 8 mA and 20 mA, the predefined minimum intensity of the current Imin is between 0 and 8 mA, the predefined maximum voltage threshold UMax is between 12 volts and 30 volts, and the predefined minimum voltage threshold Umin is between 0 and 12 volts.

The first coupler 20 has the first emitter circuit 21 connected in series with the first protection circuit 10, the assembly formed by the first emitter circuit 21 and the first protection circuit 10 being connected between the first connection point E1 and the second connection point E2, as shown in FIG. 1. The first emitter circuit 21 is designed to emit a second signal Sig2 when the control signal Sig1 is present on the control input E and when the current i is flowing in said first emitter circuit 21. The first coupler 20 also has a first receiver circuit 22 designed to receive the second signal Sig2 and to provide a third signal Sig3. Said third signal Sig3 is formed of at least one pulse, as will be described later on. The first emitter circuit 21 and the first receiver circuit 22 of said first coupler 20 are galvanically isolated from one another.

Preferably, the first coupler 20 has at least one optocoupler: the first emitter circuit 21 has an emitting diode D, the first receiver circuit 22 has a phototransistor Tr, the emitting diode D emitting radiation to the phototransistor Tr through a wall Sc transparent to the radiation, said wall being arranged between the emitting diode D and the phototransistor Tr, said radiation forming a medium for transmitting the second signal Sig2. The phototransistor Tr provides the third signal Sig3 in the same way as the second signal Sig2. The wall Sc also has an electrically insulating property, that is to say that it does not conduct electric current, so as to provide galvanic isolation between the first emitter circuit 21 and the first receiver circuit 22.

The first switch 30 is connected in parallel across the first emitter circuit 21 in order to short-circuit the first emitter circuit 21 when said first switch 30 is closed. The first emitter circuit 21 is thus able to emit only when the first switch 30 is in an open state. The first switch 30 is preferably a bipolar transistor or field-effect transistor. This configuration has the advantage of guaranteeing a constant flow of a current i as soon as a control signal Sig1 is present on the control input E, regardless of the open or closed state of the first switch 30. The first switch 30 is controlled by the pulse generator 40.

The pulse generator 40 is connected to the first switch 30 and generates pulses in order to cyclically control opening and closure of the first switch 30. Preferably, a pulse controls closure of the first switch 30, the first switch 30 being open during the time interval between two consecutive pulses. The control signal Sig1 is therefore modulated by the pulses delivered by the pulse generator 40.

The pulse generator 40 generates pulses preferably having a rectangular form, having a predefined duty cycle less than or equal to 50% at a frequency preferably of between 100 Hz and 10 kHz. The pulse generator 40 is preferably a free oscillator that is not synchronized with any other signal present in the safety control device 1.

Figure 6A:
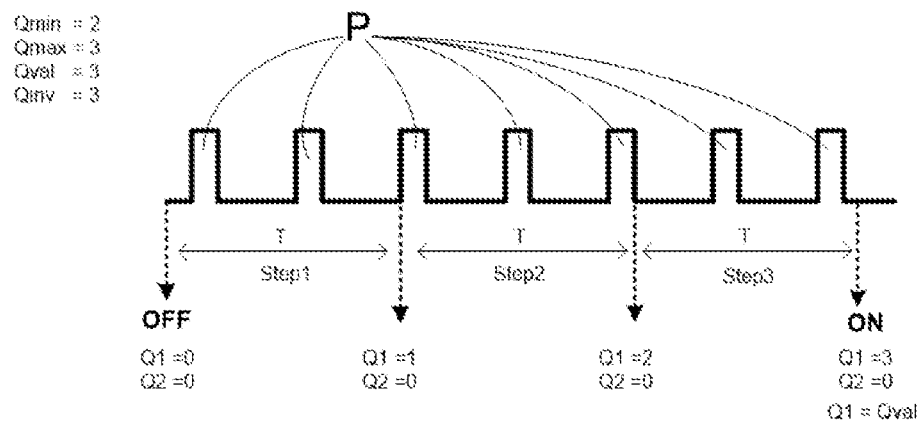
FIGS. 6a to 6d are timing diagrams of a signal received by a processing circuit forming part of a safety control device.

In the presence of a control signal Sig1, the emitting diode D of the first emitter circuit 21 emits radiation to the phototransistor Tr of the first receiver circuit 22 when the first switch 30 is open. Said phototransistor Tr then provides a pulse forming the third signal Sig3, as shown in FIG. 6a. When the first switch 30 is closed, the first emitter circuit 21 no longer emits radiation to the phototransistor Tr, and the third signal Sig3 becomes zero. The third signal Sig3 thus contains at least one pulse P when the control signal Sig1 is present and when the pulse generator 40 is generating pulses.

The first processing circuit 50 is connected to the first receiver circuit 22 in order to receive the third signal Sig3. Said first processing circuit 50 is designed to execute a safety processing method 500 described later on in order to process the third signal Sig3 and provide a first safety control order Sig4. Said first safety control order Sig4 may adopt at least two states:
 a first start safety control order Sig4_ON, or
 a first stop safety control order Sig4_OFF.

The first start safety control order Sig4_ON corresponds to a start safety command, and the first stop safety control order Sig4_OFF corresponds to a stop safety command, which is particularly suitable for a safe emergency stop order.

Figure 3:
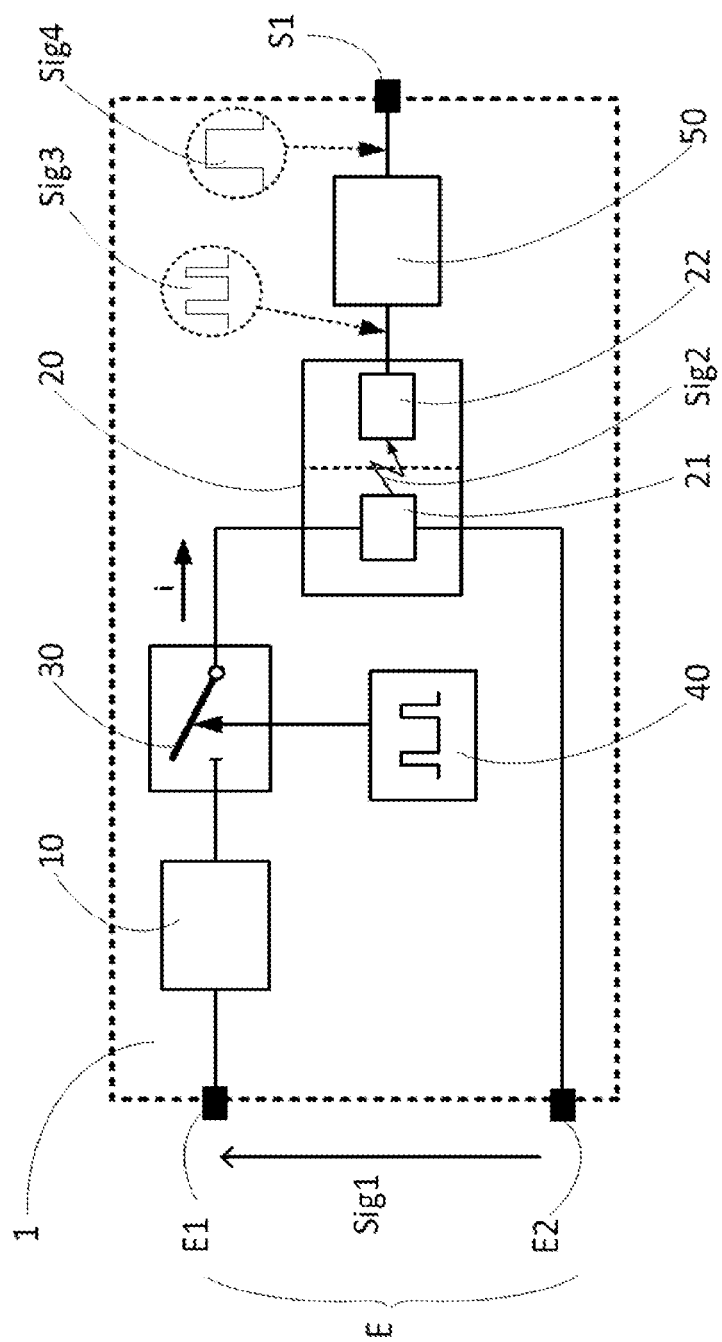
FIG. 3 shows, in the form of a block diagram, a connection variant for a first switch in a safety control device.

According to one connection variant for the first switch 30, said first switch 30 is connected in series with the first protection circuit 10 and the first emitter circuit 21, as shown in FIG. 3. In this case, the third signal Sig3 is formed of pulses P when the control signal Sig1 is present on the input E and when the first switch 30 is closed. The processing performed by the first processing circuit 50 on the third signal Sig3 is unchanged.

Figure 4:
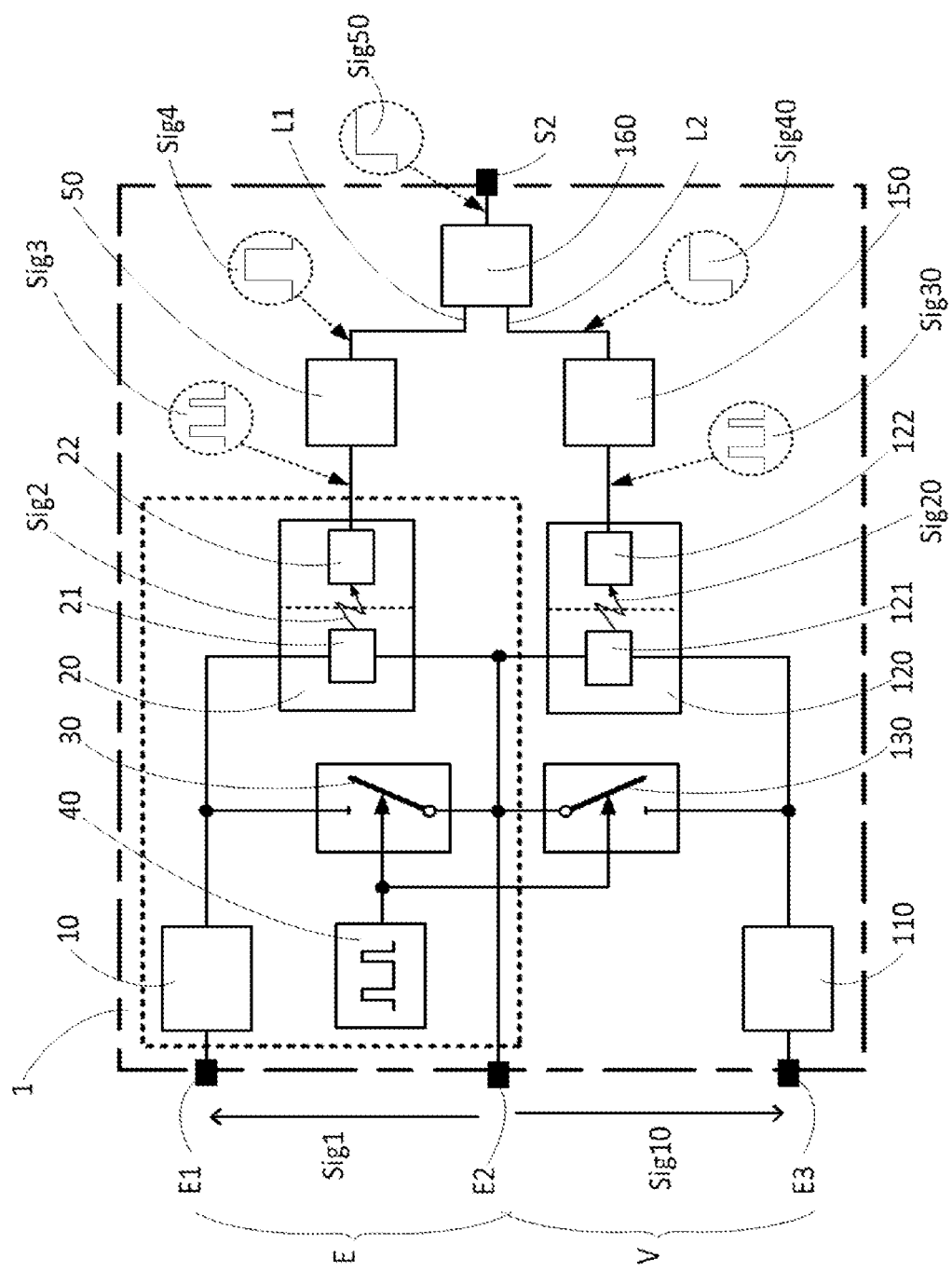
FIG. 4 shows, in the form of a block diagram, a safety control device having a validation input.

It is often necessary to implement a double safety command in a safety installation. Such a double command contains a first safety command whose role is to control starting and a second safety command whose role is to validate or authorize, and the absence of which generally corresponds to an emergency stop command. In order to meet this need, the invention also relates to a safety control device 1, shown in FIG. 4, having a safety control device 1 as described above, and furthermore having:
 a validation input V having a third connection point E3, said validation input V being designed to receive a validation signal Sig10 applied between the second connection point E2 and said third connection point E3,
 a second protection circuit 110,
 a second coupler 120 having:
  a second emitter circuit 121 connected in series with the second protection circuit 110, the assembly formed by the second emitter circuit 121 and the second protection circuit 110 being connected between the third connection point E3 and the second connection point E2, said second emitter circuit 121 being designed to emit a fourth signal Sig20 when the validation signal Sig10 is present on the validation input V, and
  a second receiver circuit 122 designed to receive the fourth signal Sig20 and to provide a fifth signal Sig30,
 a second switch 130 connected firstly in parallel across the second emitter circuit 121 in order to short-circuit said second emitter 121 when it is closed, and connected secondly to the pulse generator 40 so that said pulse generator 40 cyclically controls opening and closure of said second switch 130,
 a second processing circuit 150 connected to the second receiver circuit 122 in order to receive the fifth signal Sig30, said second processing circuit 150 being designed to process the fifth signal Sig30 and provide a second safety control order able to adopt at least two states:
  a second start safety control order Sig40_ON, and
  a second stop safety control order Sig40_OFF, and
 a logic circuit 160 having:
  a first binary input L1 connected to the first processing circuit 50 in order to receive the first safety control order Sig4,
  a second binary input L2 connected to the second processing circuit 150 in order to receive the second safety control order Sig40, and
  a second binary output S2 for providing a third safety control order Sig50.

The third safety control order Sig50 may adopt at least two states:
 a third start safety control order Sig50_ON when the first safety control order Sig4 provided by the safety control device 1 is a first start safety control order Sig4_ON and when the second safety control order Sig40 is a second start safety control order Sig40_ON, or else
 a third stop safety control order Sig50_OFF when the first safety control order Sig4 provided by the safety control device 1 is a first stop safety control order Sig4_OFF or when the second safety control order Sig40 is a second stop safety control order Sig40_OFF.

The third start safety control order Sig50_ON is given when the first start safety control order Sig4_ON and the second safety control order Sig40 are provided by the first and second processing circuits 50, 150, respectively. The third stop safety control order Sig50_OFF is provided:
 when the first stop safety control order Sig4_OFF is provided by the first processing circuit 50, or
 when the second stop safety control order Sig40_OFF is provided by the second processing circuit 150.

The second protection circuit 110 is similar to the first protection circuit 10,
 the second coupler 120 is similar to the first coupler 20,
 the second switch 130 is similar to the first switch 30, and
 the second processing circuit 150 is similar to the first processing circuit 50.

Figure 5A:
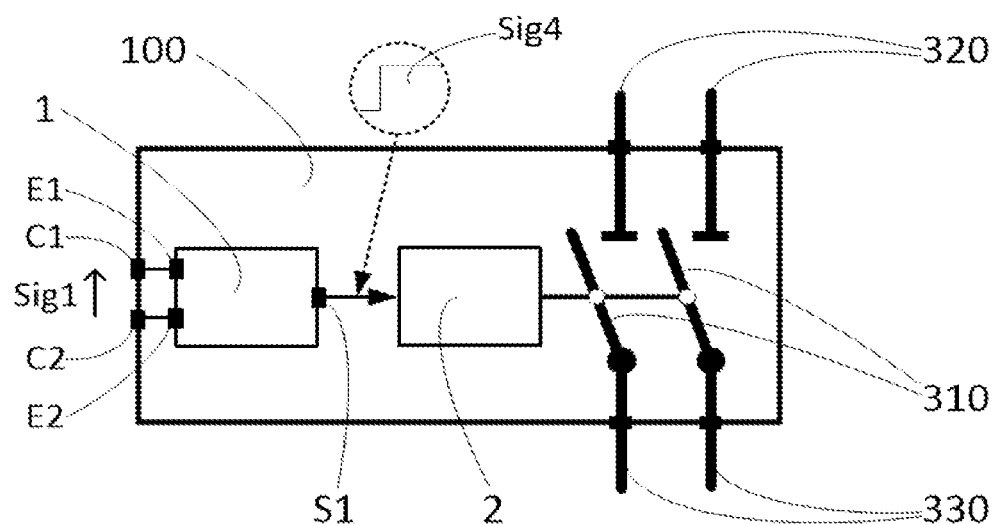
FIG. 5a shows, in the form of a block diagram, a contactor having a safety control device.

The invention also relates to a contactor 100 shown in the form of a block diagram in FIG. 5a. Said contactor 100 has:
 at least one electrical contact 310 connected to at least one upstream current line 320 and one downstream current line 330, said electrical contact 310 being designed to allow the flow of an electric current between the upstream current line 320 and the downstream current line 330 to be permitted or blocked,
 an actuator 2 designed to actuate the at least one electrical contact 310,
 a safety control device 1 as described above,
 a first connection terminal C1 connected to the first connection point E1 of said safety control device 1, and
 a second connection terminal C2 connected to the second connection point E2 of said safety control device 1, the control signal Sig1 being applied between the first connection terminal C1 and the second connection terminal C2. The safety control device 1 thus receives the control signal Sig1 on its safety control input E.

The safety control device is connected, via the first binary output S1, to the actuator 2 in order to provide a first safety control order Sig4 to said actuator 2 in order to control the actuation of the at least one electrical contact 310 when the control signal Sig1 is received on its safety control input E. The safety control device 1 controls the actuator 2:
 so as to execute closure of the at least one electrical contact 310 when the first safety control order Sig4 is a first start safety control order Sig4_ON, or so as to execute opening of the at least one electrical contact 310 when the first safety control order Sig4 is a first stop safety control order Sig4_OFF.

Figure 5B:
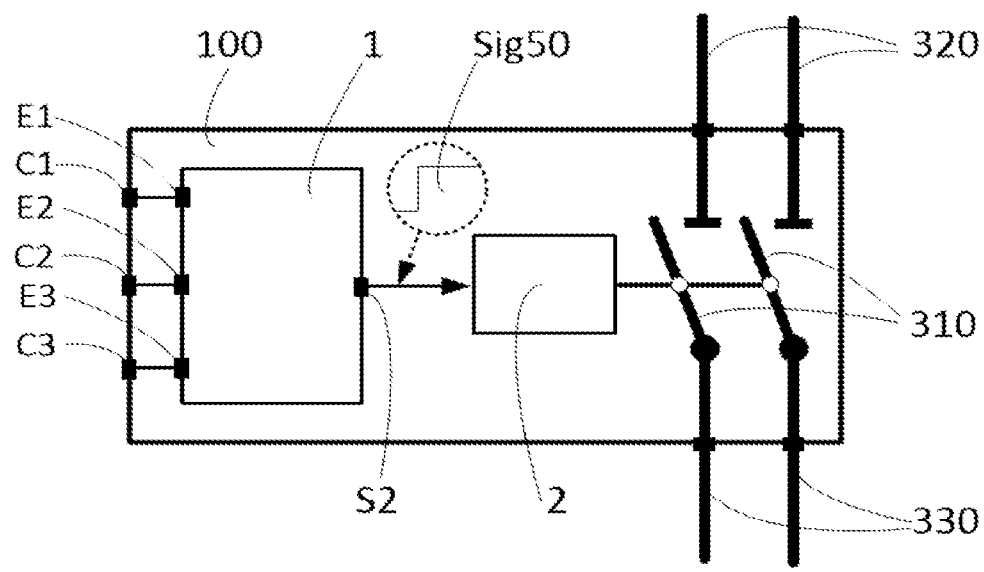
FIG. 5b shows a contactor having a safety control device having a validation input.

According to one preferred embodiment, the contactor 100, shown in the form of a block diagram in FIG. 5b, furthermore has a third connection terminal C3 connected to the third connection point E3 of the safety control device 1. The validation signal Sig10 is applied between the second connection terminal C2 and said third connection terminal C3.

Such a contactor 100 has two safety control inputs: a control signal Sig1, applied between the first and the second connection terminal, respectively C1 and C2, received on the control input E of the safety control device 1, corresponds to a start command. A validation signal Sig10, applied between the second connection terminal C2 and the third connection terminal C3, received on the validation input V of the safety control device 1, corresponds to validation or authorization of a command conveyed by the control signal Sig1. The absence of said validation signal Sig10 corresponds to an emergency stop request. The validation signal Sig10 is preferably a continuous voltage interval or stage with an amplitude of between 1 volt and 30 volts.

The safety control device 1 is connected to the actuator via a second binary output S2 in order to provide a third safety control order Sig50 to the actuator 2, said third safety control order Sig50 being able to adopt two states, as described above:
  a third start safety control order Sig50_ON, or
  a third stop safety control order Sig50_OFF.
  Said contactor 100 is designed such that:
  the safety control device 1 provides a third start safety control order Sig50_ON to the actuator 2 in order to control the actuator 2 so as to execute closure of at least one electrical contact 310 when the first safety control order Sig4 is a first start safety control order Sig4_ON and when the second safety control order Sig40 is a second start safety control order Sig40_ON, or
  the safety control device 1 provides a third stop safety control order Sig50_OFF to the actuator 2 in order to control the actuator 2 so as to execute opening of at least one electrical contact 310 when the first safety control order Sig4 is a first stop safety control order Sig4_OFF or when the second safety control order Sig40 is a second stop safety control order Sig40_OFF.

The control signal Sig1 is thus validated when the first processing circuit 50 has validated the compliance of the control signal Sig1 and when the second processing circuit 150 has validated the compliance of the validation signal Sig10. If either the control signal Sig1 or the validation signal Sig10 does not comply, then the contactor 100 will be put into a safe state, corresponding to opening at least one electrical contact 310, in order to protect personnel and prevent or limit damage to hardware.

Other operating modes of the contactor 100 are possible, in particular a mode in which the control signal Sig1 is a pulsed signal of limited duration and the validation signal Sig10 has a role of authorizing/validating said command to close the actuator 2. The validation signal Sig10 is applied first of all or at the same time as the control signal Sig1, following which the actuator 2 is actuated and at least one electrical contact 310 is closed. Said actuator 2 then remains actuated even though the control signal Sig1 has disappeared. By contrast, as soon as the validation signal Sig10 disappears, the actuator 2 is deactivated, and at least one electrical contact 310 is opened. Such operation may easily be implemented by the logic circuit 160.

A contactor 100 may have a single electrical contact 310 connected between an upstream current line 320 and a downstream current line 330, or else two electrical contacts 310 connected between two upstream current lines 320 and two downstream current lines 330, the two electrical contacts 310 being isolated from one another, the upstream current lines 320 and the downstream current lines 330 also being isolated from one another, as shown in FIGS. 5a and 5b. A contactor 100 may also be designed to operate on a three-phase network and have three electrical contacts 310, three upstream current lines 320 and three downstream current lines 330.

The first processing circuit 50 executes the safety processing method 500 in order to process the third signal Sig3 and generate the first safety control order Sig4. The second processing circuit 150 also similarly executes the safety processing method 500 in order to process the fifth signal Sig30 and generate the second safety control order Sig40. Therefore, only the safety processing method 500 performed by the first processing circuit 50 is described below.

The safety processing method 500 comprises iteratively counting a number Q of pulses P forming the third signal Sig3, said pulses P being provided by the first receiver circuit 22 during a time interval of predefined duration T, as shown by FIG. 6a.

Figure 7A:
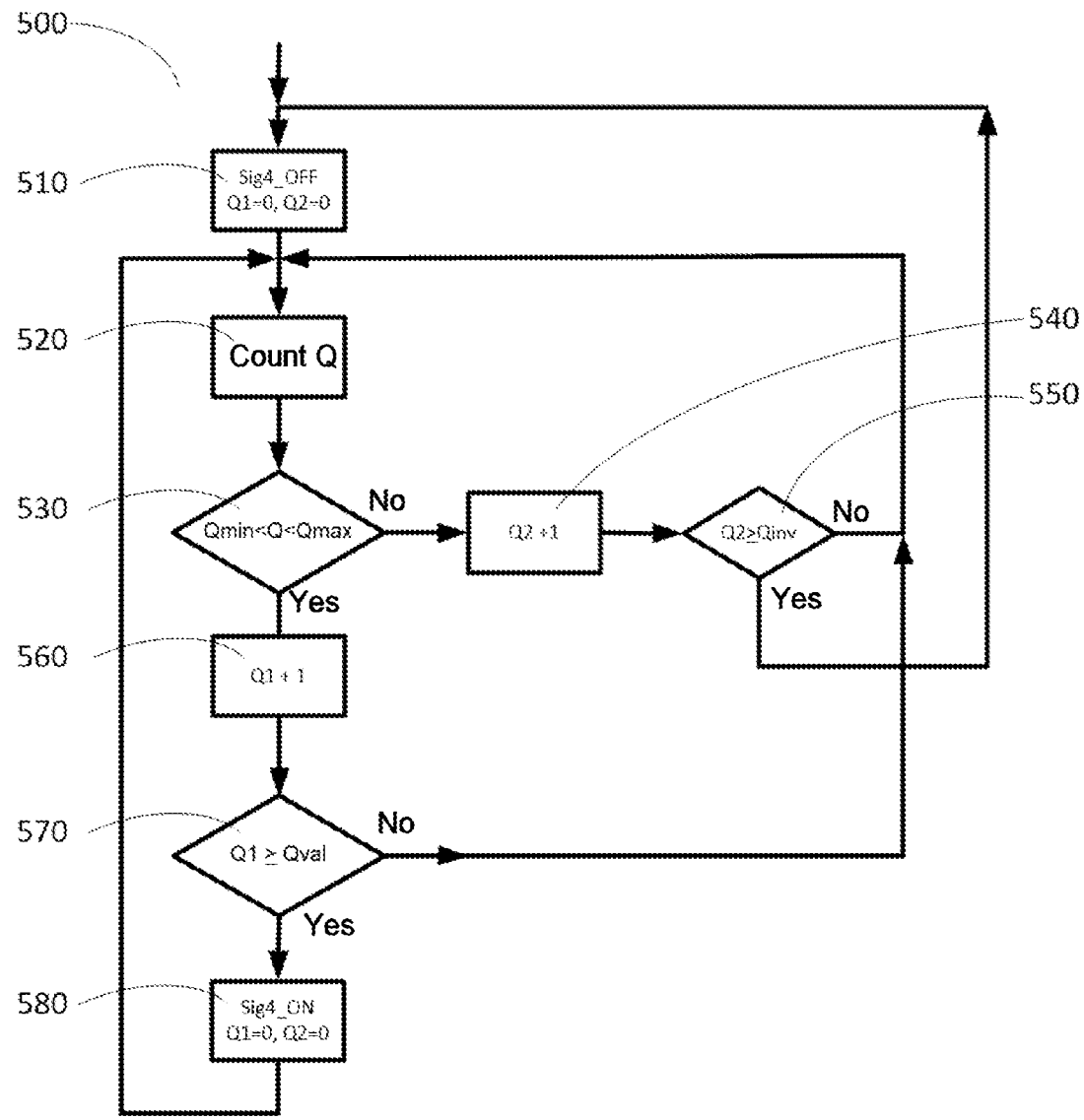
FIG. 7a shows a flowchart of a method for safely processing a signal performed by the processing circuit.

A first embodiment of the safety processing method 500 is shown in FIG. 7a. In an initialization step 510, a first stop safety control order Sig4_OFF is emitted in order to initialize the first safety control order Sig4. A first counter Q1 and a second counter Q2 are also initialized. Next, in a counting step 520, the method counts Q the number of pulses P received over a predefined time interval T. At the end of counting step 520, there is a step 530 of comparing the number Q of pulses counted with a predefined minimum number of pulses Qmin and a predefined maximum number of pulses Qmax. When the number Q of pulses counted is outside the interval between the minimum number of pulses Qmin and the maximum number of pulses Qmax, then the method continues with a step 540 of incrementing the second counter Q2. The second counter Q2 is then compared with a predefined invalidation threshold Qinv in a step 550. When the second counter Q2 is equal to or greater than the invalidation threshold Qinv, the method considers that the number Q of pulses counted is not compliant, and the method returns to initialization step 510, corresponding to a safe state, and in particular the first stop safety control order Sig4_OFF is generated. By contrast, when the number Q of pulses counted is within the interval between the minimum number of pulses Qmin and the maximum number of pulses Qmax, then the method continues with a step 560 of incrementing the first counter Q1. Next, in a step 570, the first counter Q1 is compared with a predefined validation threshold Qval. When the first counter Q1 is less than said validation threshold Qval, then the method returns to counting step 520 to execute an additional iteration. When the first counter Q1 is greater than or equal to the validation threshold Qval, the method continues with a step 580 comprising generating the first start safety control order Sig4_ON and reinitializing the first and second counters Q1 and Q2. The method then returns to counting step 520 to execute a new iteration.

Figure 7B:
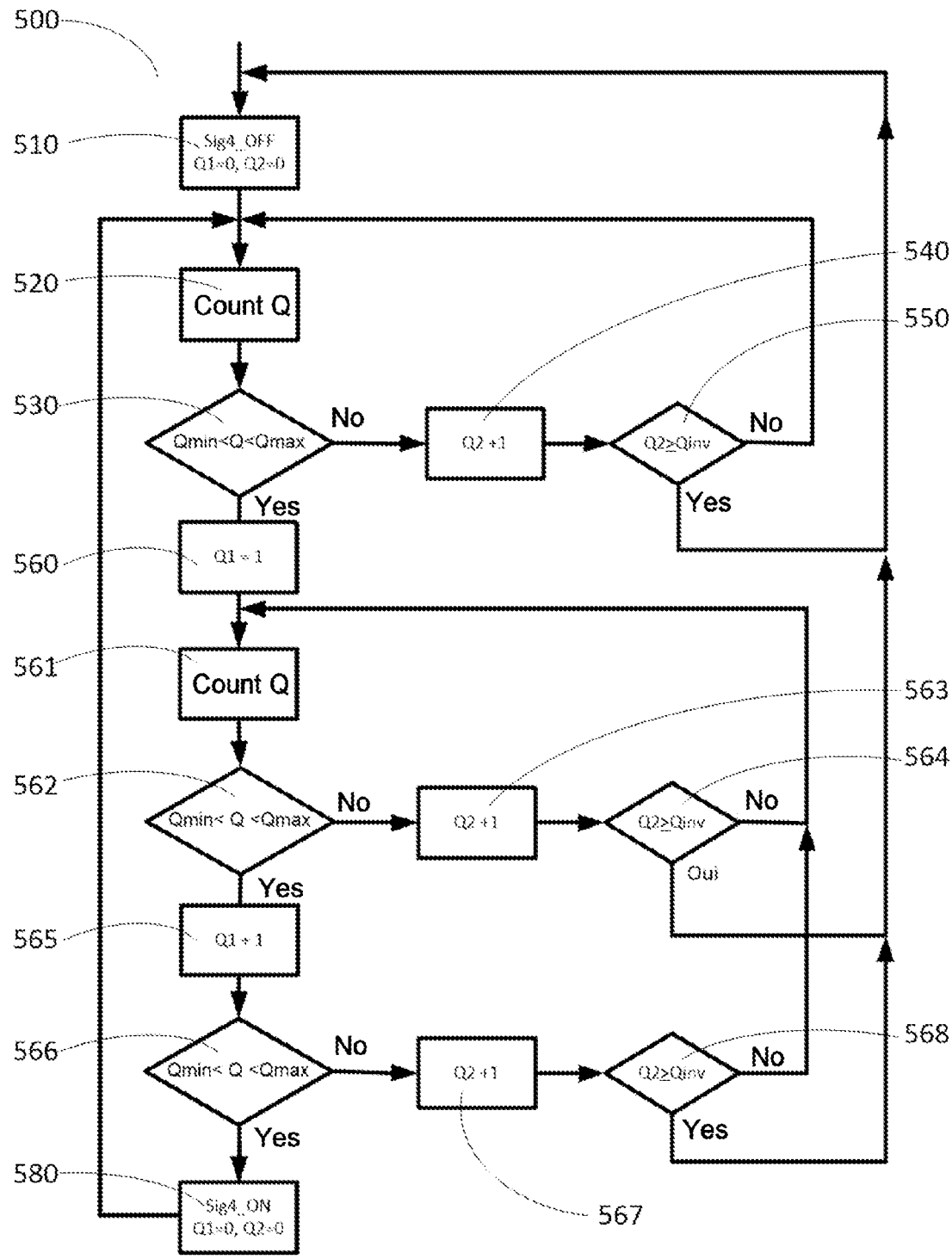
FIG. 7b shows a flowchart of a preferred variant of the safety processing method performed by the processing circuit.

A second embodiment of the safety processing method 500 is shown in FIG. 7b. The initialization step 510, counting step 520, comparison step 530, step of incrementing the second counter Q2 in step 540, step of comparison with the invalidation threshold in step 550 and step of incrementing the first counter Q1 in step 560 are identical. By contrast, after said step 560 of incrementing the first counter Q1, a second counting step 561 is performed, followed by a step 562 of comparing the number Q of pulses counted with the minimum number of pulses Qmin and with the maximum number of pulses Qmax. When the number Q of pulses counted is less than the minimum number of pulses Qmin or greater than the maximum number of pulses Qmax, then the method continues with a step 563 of incrementing the second counter Q2, said second counter Q2 then being compared with the invalidation threshold Qinv in a step 564. When the second counter Q2 is equal to or greater than the invalidation threshold Qinv, the method considers that the number Q of pulses counted is not compliant, and the method returns to initialization step 510, corresponding to a safe state. When the second counter Q2 is less than the invalidation threshold Qinv, the method returns to the second counting step 561. When the number Q of pulses counted in step 562 is between the minimum number of pulses Qmin and the maximum number of pulses Qmax, then the method continues with a step 565 of incrementing the first counter Q1 and a new monitoring loop for monitoring the number Q of pulses P received during a time interval T in the comparison step 566, incrementation step 567 and comparison step 568. In particular, in comparison step 568, when the second counter Q2 is less than the invalidation threshold Qinv, the method returns to the second counting step 561. The second embodiment of the safety processing method 500 thus described requires the number Q of pulses P counted in two successive time intervals T to be within the interval between the minimum number of pulses Qmin and the maximum number of pulses Qmax. Said second embodiment is therefore more exacting than the first embodiment of the method shown in FIG. 7a, and it is better suited to implementation in industrial environments subject to significant electromagnetic interference. Other method variants for counting the number of pulses Q and decision criteria for generating the first safety control order may be constructed on the basis of the methods described above in order to adapt the method to particular environments.

Figure 6B:
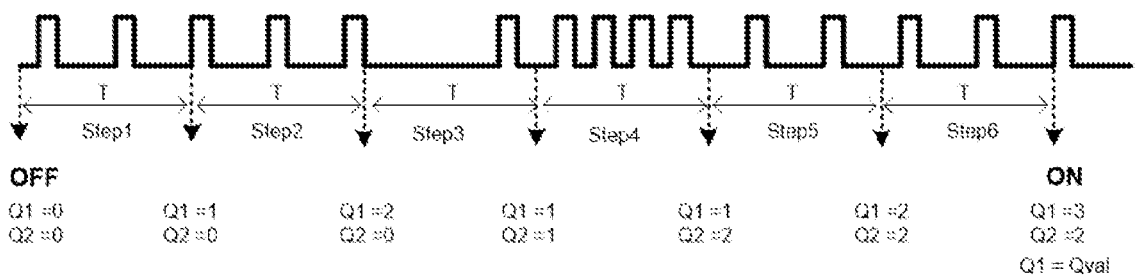

Preferably, the minimum number of pulses Qmin is between 2 and 5, the maximum number of pulses Qmax is between 3 and 50, the validation threshold Qval is between 2 and 10, the invalidation threshold Qinv is between 2 and 5, and the duration of the time interval T is between 1 ms and 10 ms. FIG. 6b illustrates, by way of a timing diagram, an example of counting a number Q of pulses P forming the third signal Sig3 and the evolution of the first and second counters Q1 and Q2 over time. In this example, Qmin=2, Qmax=3, Qval=3, Qinv=3. At the initial time, the first and second counters Q1 and Q2 are initialized at zero. In a first time interval T, corresponding to a first iteration STEP1, two pulses P are counted, therefore Q=2, and the first counter Q1 is incremented, Q1=1, since Q is between Qmin and Qmax. In the following period T corresponding to the iteration STEP2, three pulses P are counted, and therefore the first counter Q1 is incremented once more, Q1=2. In the following period T corresponding to the iteration STEP3, a single pulse P is counted, therefore Q=1. The first counter Q1 is not incremented since the number Q of pulses counted is outside the interval between the minimum number of pulses Qmin and the maximum number of pulses Qmax, as verified in comparison step 530. By contrast, the second counter Q2 is incremented. In the following period T corresponding to the iteration STEP4, four pulses P are counted, and the first counter Q1 is not incremented whereas the second counter Q2 is incremented, since the number Q of pulses counted is outside the interval between the minimum number of pulses Qmin and the maximum number of pulses Qmax. In the following period T corresponding to the iteration STEP5, two pulses are counted, and the first counter Q1 is incremented and adopts the value 2. In the following period T corresponding to the iteration STEP6, the first counter Q1 is incremented since two pulses P are counted in the period T. The first counter Q1 reaches the value 3 corresponding to the validation threshold Qval chosen in this example, and the command is therefore safe, a first start safety control order Sig4_ON is emitted, the first and second counters Q1 and Q2 are reinitialized at zero and the method returns to counting step 520 to execute a new iteration.

Figure 6C:
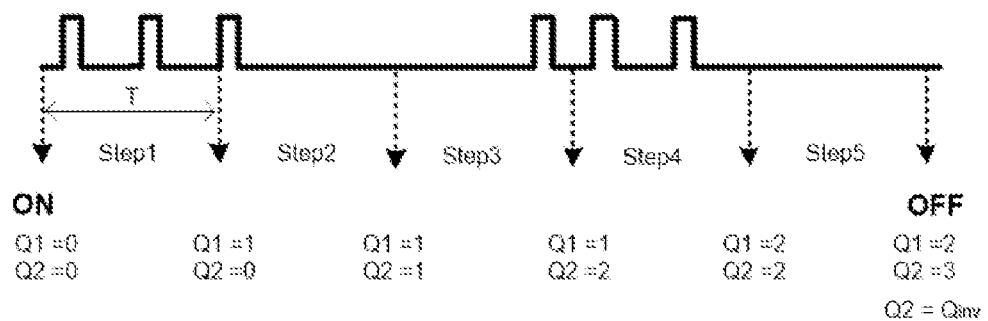

FIG. 6c illustrates a second example of counting a number Q of pulses P forming the third signal Sig3 and the evolution of the first and second counters Q1 and Q2 over time. At the initial time, the first and second counters Q1 and Q2 are at zero. In a first time interval T, corresponding to a first iteration STEP1, two pulses P are counted, and therefore the first counter Q1 is incremented. In the following period T corresponding to the iteration STEP2, a single pulse P is counted. The first counter Q1 is not incremented but the second counter Q2 is incremented, since the number Q of pulses counted is outside the interval between the minimum number of pulses Qmin and the maximum number of pulses Qmax. The same applies in the following period T corresponding to the iteration STEP3 since a single pulse P is counted, and the second counter Q2 is equal to 2. In the following period T corresponding to the iteration STEP4, two pulses P are counted, and the first counter Q1 is incremented, and therefore Q1=2. In the following period T corresponding to the iteration STEP5, there is no pulse P, and the second counter Q2 is incremented and reaches the value 3 equal to the invalidation threshold Qinv chosen in this example. The safety command is therefore invalidated, and the method returns to initialization step 510 corresponding to a safe state. The first stop safety control order Sig4_OFF is generated, the first and second counters Q1 and Q2 are reinitialized at zero and the method continues with counting step 520 to execute a new iteration.

Figure 6D:
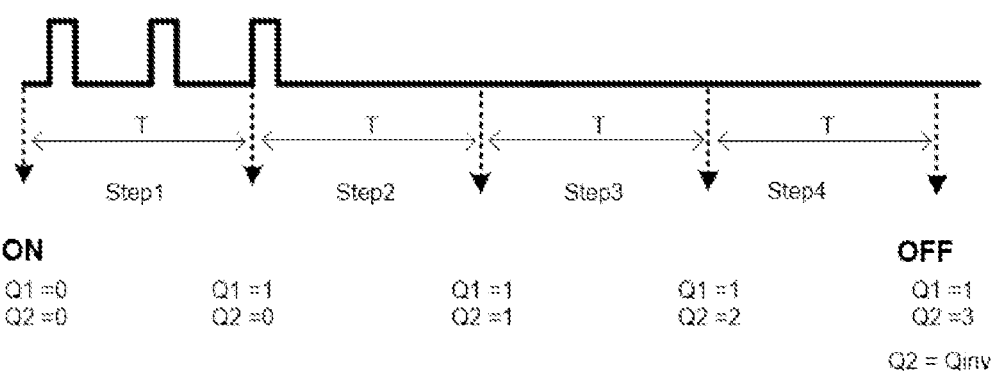

FIG. 6d illustrates a third example in which the number of pulses Q counted in 3 iterations STEP2, STEP3 and STEP4 is equal to 0. The second counter Q2 then reaches the value 3 at the end of the iteration STEP4 and the first stop safety control order Sig4_OFF is generated. This example illustrates operation of a safe emergency stop command.

The first counter Q1 thus counts the number of iterations STEP1, STEP2, STEP3, etc. in which the number Q of pulses P is within the interval of expected values, and the second counter Q2 counts the number of iterations STEP1, STEP2, STEP3, etc. in which the number Q of pulses P is outside the interval of expected values. The response time of such a method makes it possible to validate a safety control order within a period greater than or equal to (Qval×T) after the onset of the occurrence of the third signal Sig3. For example, when Qval=3 and T=3 ms, the response time is greater than or equal to 9 ms, whether for a first start safety control order or a first stop safety control order.

The safety control device 1 and the safety processing method on which the invention is based contribute to monitoring and validating a start or stop command for a contactor so as firstly to avoid any unwanted command initialized for example by electromagnetic interference and secondly to reliably execute an emergency stop request. Galvanic isolation between inputs and outputs is additionally provided by the first and the second coupler. Lastly, implementing at least one first switch 30 in combination with a pulse generator 40 allows self-control of the circuits forming the safety control device 1 or of the safety control device 1. Such safety control circuits and the safety processing method that they comprise may also be implemented in order to remotely control a circuit breaker or any other safety element. They are particularly suitable for installations requiring SIL1 certification.

The invention claimed is:

1. A safety control device configured to process a control signal and generate a first safety control order, said safety control device comprising:
   a control input having at least a first connection point and a second connection point, said control input being configured to receive the control signal,
   a first protection circuit,
   a first coupler having:
      a first emitter circuit connected in series with the first protection circuit, the assembly formed by the first emitter circuit and the first protection circuit being connected between the first connection point and the second connection point, said first emitter circuit being designed to emit a second signal when the control signal is present on the control input, and
      a first receiver circuit designed to receive the second signal and to provide a third signal formed of at least one pulse,
   a first switch connected in parallel across the first emitter circuit or connected in series with the first protection circuit and the first emitter circuit,
   a pulse generator connected to the first switch and designed to cyclically control opening and closure of the first switch, and
   a first processing circuit connected to the first receiver circuit in order to receive the third signal, said first processing circuit being designed to process the third signal and provide the first safety control order, said first safety control order being able to adopt at least two states:
      a first start safety control order, or
      a first stop safety control order,
   wherein the first protection circuit has a current-limiting circuit for limiting the current flowing through said protection circuit,
   wherein the first protection circuit has a current threshold detection circuit connected to the current-limiting circuit in order to limit the current flowing through said protection circuit to a predefined maximum intensity when the amplitude of the control signal is greater than a predefined maximum voltage threshold, and
   wherein a voltage threshold detection circuit is connected in series with the first protection circuit and the first emitter circuit in order to limit the current flowing through said emitter circuit to a predefined minimum intensity when the amplitude of the control signal is less than a predefined minimum voltage threshold.

2. The safety control device according to claim 1, wherein the first emitter circuit and the first receiver circuit are galvanically isolated from one another.

3. The safety control device according to claim 1, wherein the first coupler has at least one optocoupler, the first emitter circuit having an emitting diode and the first receiver circuit having a phototransistor, the emitting diode emitting radiation that forms a medium for transmitting the second signal to the phototransistor through an electrically insulating wall transparent to the radiation.

4. The safety control device according to claim 1, wherein the pulse generator generates pulses having a predefined duty cycle less than or equal to 50%.

5. The safety control device according to claim 1, wherein the pulse generator generates pulses at a frequency of between 100 Hz and 10 kHz.

6. The safety control device according to claim 1, further comprising:
   a validation input having a third connection point, said validation input being designed to receive a validation signal,
   a second protection circuit,
   a second coupler having:
      a second emitter circuit connected in series with the second protection circuit, the assembly formed by the second emitter circuit and the second protection circuit being connected between the third connection point and the second connection point of the safety control device, said second emitter circuit being designed to emit a fourth signal when the validation signal is present on the validation input, and
      a second receiver circuit designed to receive the fourth signal and to provide a fifth signal,
   a second switch connected firstly in parallel across the second emitter circuit and connected secondly to the pulse generator so that said pulse generator cyclically controls opening and closure of said second switch,
   a second processing circuit connected to the second receiver circuit in order to receive the fifth signal, said second processing circuit being designed to process the fifth signal and provide a second safety control order, said second safety control order being able to adopt at least two states:
      a second start safety control order and
      a second stop safety control order,
   a logic circuit having:
      a first binary input connected to the first processing circuit in order to receive the first safety control order,
      a second binary input connected to the second processing circuit in order to receive the second safety control order, and
      a second binary output for providing a third safety control order.

7. The safety control device according to claim 6, wherein the third safety control order adopts at least two states:
   a third start safety control order when a first safety control order provided by the safety control device is a first start safety control order and when the second safety control order is a second start safety control order, or
   a third stop safety control order when a first safety control order provided by the safety control device is a first stop safety control order or when the second safety control order is a second stop safety control order.

8. A method for safely processing a third signal formed of at least one pulse provided by at least a first receiver circuit of a safety control device according to claim 1, said method comprising iteratively counting a number of pulses provided by the first receiver circuit during a time interval of a predefined duration.

9. The method for safely processing a third signal according to claim 8, wherein a first counter is incremented when a number of pulses counted during a time interval is between a predefined minimum number of pulses and a predefined maximum number of pulses.

10. The method for safely processing a third signal according to claim 9, wherein a first start safety control order is generated when the first counter is equal to or greater than a predefined validation threshold.

11. The method for safely processing a third signal according to claim 9, wherein a second counter is incremented when the number of pulses counted during the time interval is not between the minimum number of pulses and the maximum number of pulses.

12. The method for safely processing a third signal according to claim 11, wherein a first stop safety control order is generated when the second counter is equal to or greater than a predefined invalidation threshold.

13. A method for safely processing a third signal formed of at least one pulse provided by at least a first receiver circuit of a safety control device, said safety control device configured to process a control signal and generate a first safety control order, said safety control device comprising:
a control input having at least a first connection point and a second connection point, said control input being configured to receive the control signal,
a first protection circuit,
a first coupler having:
a first emitter circuit connected in series with the first protection circuit, the assembly formed by the first emitter circuit and the first protection circuit being connected between the first connection point and the second connection point, said first emitter circuit being designed to emit a second signal when the control signal is present on the control input, and
a first receiver circuit designed to receive the second signal and to provide a third signal formed of at least one pulse,
a first switch connected in parallel across the first emitter circuit or connected in series with the first protection circuit and the first emitter circuit,
a pulse generator connected to the first switch and designed to cyclically control opening and closure of the first switch, and
a first processing circuit connected to the first receiver circuit in order to receive the third signal, said first processing circuit being designed to process the third signal and provide the first safety control order, said first safety control order being able to adopt at least two states:
a first start safety control order, or
a first stop safety control order,
said method comprising iteratively counting a number of pulses provided by the first receiver circuit during a time interval of a predefined duration,
wherein a first counter is incremented when a number of pulses counted during a time interval is between a predefined minimum number of pulses and a predefined maximum number of pulses, and
wherein a first start safety control order is generated when the first counter is equal to or greater than a predefined validation threshold.

14. The method for safely processing a third signal according to claim 13, wherein a second counter is incremented when the number of pulses counted during the time interval is not between the minimum number of pulses and the maximum number of pulses.

15. The method for safely processing a third signal according to claim 14, wherein a first stop safety control order is generated when the second counter is equal to or greater than a predefined invalidation threshold.

16. A method for safely processing a third signal formed of at least one pulse provided by at least a first receiver circuit of a safety control device, said safety control device configured to process a control signal and generate a first safety control order, said safety control device comprising:
a control input having at least a first connection point and a second connection point, said control input being configured to receive the control signal,
a first protection circuit,
a first coupler having:
a first emitter circuit connected in series with the first protection circuit, the assembly formed by the first emitter circuit and the first protection circuit being connected between the first connection point and the second connection point, said first emitter circuit being designed to emit a second signal when the control signal is present on the control input, and
a first receiver circuit designed to receive the second signal and to provide a third signal formed of at least one pulse,
a first switch connected in parallel across the first emitter circuit or connected in series with the first protection circuit and the first emitter circuit,
a pulse generator connected to the first switch and designed to cyclically control opening and closure of the first switch, and
a first processing circuit connected to the first receiver circuit in order to receive the third signal, said first processing circuit being designed to process the third signal and provide the first safety control order, said first safety control order being able to adopt at least two states:
a first start safety control order, or
a first stop safety control order,
said method comprising iteratively counting a number of pulses provided by the first receiver circuit during a time interval of a predefined duration,
wherein a first counter is incremented when a number of pulses counted during a time interval is between a predefined minimum number of pulses and a predefined maximum number of pulses, and
wherein a second counter is incremented when the number of pulses counted during the time interval is not between the minimum number of pulses and the maximum number of pulses.

17. The method for safely processing a third signal according to claim 16, wherein a first stop safety control order is generated when the second counter is equal to or greater than a predefined invalidation threshold.

18. A contactor comprising:
at least one electrical contact connected to an upstream current line and a downstream current line, said electrical contact being configured to allow the flow of an electric current between the upstream current line and the downstream current line to be permitted or blocked,
an actuator designed to actuate the at least one electrical contact,
a safety control device according to claim 1, said safety control device being connected to the actuator in order to provide a first safety control order to said actuator in order to control the actuation of the at least one electrical contact,
a first connection terminal connected to a first connection point of said safety control device, and
a second connection terminal connected to a second connection point of said safety control device, wherein the safety control device controls the actuator:
so as to execute closure of the at least one electrical contact when the first safety control order is a first start safety control order, or
so as to execute opening of the at least one electrical contact when the first safety control order is a first stop safety control order.

19. The contactor according to claim 18, wherein the contactor further comprises a third connection terminal connected to a third connection point of the safety control device, said safety control device being connected to the actuator via a second binary output in order to provide a third safety control order to the actuator and thus control said actuator:
so as to execute closure of the at least one electrical contact when the third safety control order is a third start safety control order, or
so as to execute opening of the at least one electrical contact when the third safety control order is a third stop safety control order.

\* \* \* \* \*